(12) United States Patent
Yomo et al.

(10) Patent No.: US 7,966,360 B2
(45) Date of Patent: *Jun. 21, 2011

(54) FINITE IMPULSE RESPONSE FILTER AND DIGITAL SIGNAL RECEIVING APPARATUS

(75) Inventors: Hidekuni Yomo, Kawasaki (JP);
Yoshinori Kunieda, Sagamihara (JP);
Yuuri Yamamoto, Mitaka (JP)

(73) Assignee: Panasonic Corporation, Osaka (JP)

( * ) Notice: Subject to any disclaimer, the term of this patent is extended or adjusted under 35 U.S.C. 154(b) by 992 days.

This patent is subject to a terminal disclaimer.

(21) Appl. No.: 11/833,030

(22) Filed: Aug. 2, 2007

(65) Prior Publication Data

US 2007/0276892 A1 Nov. 29, 2007

Related U.S. Application Data

(63) Continuation of application No. 10/475,090, filed as application No. PCT/JP03/03056 on Mar. 14, 2003, now Pat. No. 7,254,598.

(30) Foreign Application Priority Data

Mar. 14, 2002 (JP) .................................. 2002-069715

(51) Int. Cl.
*G06F 17/10* (2006.01)
(52) U.S. Cl. ....................................................... 708/319
(58) Field of Classification Search .................. None
See application file for complete search history.

(56) References Cited

U.S. PATENT DOCUMENTS

| 5,648,987 | A | 7/1997 | Yang et al. |
| 5,907,295 | A | 5/1999 | Lin |
| 6,192,386 | B1 | 2/2001 | Shinde |
| 6,591,283 | B1 | 7/2003 | Conway et al. |
| 7,051,059 | B2 | 5/2006 | Kanasugi et al. |
| 7,493,354 | B2 * | 2/2009 | Hatamian ...................... 708/319 |
| 2002/0023115 | A1 * | 2/2002 | Kanasugi et al. ............. 708/313 |
| 2002/0078114 | A1 | 6/2002 | Wang et al. |

(Continued)

FOREIGN PATENT DOCUMENTS

JP 6 0077542 5/1985

(Continued)

OTHER PUBLICATIONS

English language Abstract of JP 60-077542, May 2, 1985.

(Continued)

*Primary Examiner* — David H Malzahn
(74) *Attorney, Agent, or Firm* — Greenblum & Bernstein, P.L.C.

(57) ABSTRACT

An A/D conversion section performs oversampling on an analog signal at a rate M times a symbol rate to convert the analog signal into a digital signal. A FIR filtering section has two delay-element sequences, each with a plurality of delay elements. The two delay-element sequences have different delay directions, i.e., a forward direction and a reverse direction. The delay directions can be switched, and according to a finite impulse response train having such delay-element sequences, a convolutional calculation is performed. A phase determining section determines a phase used in making a decision in a decision section. The decision section makes a decision on a filtered signal using the phase determined in the phase determining section to generate bit data. A digital signal receiving apparatus is thus achieved which determines a phase with a high accuracy without increasing the oversampling number, and performs a fast calculation while having a reduced circuitry scale.

19 Claims, 16 Drawing Sheets

U.S. PATENT DOCUMENTS

2002/0152251 A1  10/2002  Jang

FOREIGN PATENT DOCUMENTS

| JP | 6 0254909 | 12/1985 |
| JP | 2 216907 | 8/1990 |
| JP | 5 63510 | 3/1993 |
| JP | 1 1341087 | 12/1999 |

OTHER PUBLICATIONS

English language Abstract of JP 60-254909, Dec. 16, 1985.
English language Abstract of JP 2-216907, Aug. 29, 1990.
English language Abstract of JP 5-63510, Mar. 12, 1993.
English language Abstract of JP 11-341087, Dec. 10, 1999.

\* cited by examiner

FINITE IMPULSE RESPONSE FILTER AND DIGITAL SIGNAL RECEIVING APPARATUS

CROSS-REFERENCE TO RELATED APPLICATIONS

This application is a continuation application of U.S. patent application Ser. No. 10/475,090, filed on Oct. 24, 2003, from which U.S. Pat. No. 7,254,598 issued on Aug. 7, 2007, and which is a U.S. National Stage Application of PCT/JP03/03056, filed Mar. 14, 2003, which claims the benefit of Japanese Application No. 2002-069715, filed on Mar. 14, 2002, which are hereby incorporated by reference in their entireties.

TECHNICAL FIELD

The present invention relates to a finite impulse response filter for performing digital filtering and a digital signal receiving apparatus with the finite impulse response filter, and for example, is suitable for use in digital signal processing in a radio communication receiving apparatus.

BACKGROUND ART

FIG. 1 is a block diagram illustrating a conventional digital signal receiving apparatus. In FIG. 1, A/D conversion section 11 performs oversampling on an analog signal at a rate M times the symbol rate to convert into a digital signal. The digital signal is output to FIR filtering section 12. FIR filtering section 12 performs digital filtering on the digital signal output from A/D conversion section 11 to output to phase determining section 13 and decision section 14. Phase determining section 13 determines an optimal phase based on the signal output form FIR filtering section 12, and outputs a determined result to decision section 14. Based on the phase determined in phase determining section 13, decision section 14 makes a decision on the signal output from FIR filtering section 12 to generate bit data.

In the conventional digital signal receiving apparatus, since reception performance deteriorates when a phase determined in phase determining section 13 differs from an optimal phase, general countermeasures are to increase the oversampling number to reduce the deterioration.

FIG. 2 is a graph illustrating the relationship between the oversampling number and reception performance. FIG. 2 shows a simulation result of a case where demodulation is performed by 16 QAM. In FIG. 2, the solid line shows theoretical values, the dotted line shows a case where the oversampling number is 8 times the symbol rate, and the dot-dash line shows a case where the oversampling number is 16 times the symbol rate. As can be seen from FIG. 2, at BER of 10-3, the 8-times oversampling degrades the CN ratio by about 1.5 dB with respect to the theoretical value. Meanwhile, the 16-times oversampling suppresses the degradation to about 0.5 dB with respect to the theoretical value.

However, when the oversampling number is thus increased to prevent the reception performance from deteriorating, the operation speed required for the device becomes extremely fast in processing of signal with a high symbol rate. Therefore, it is necessary to use an A/D converter and digital signal processing device for performing high-speed processing, but such devices need to have high performance, and thus become expensive.

In cope with the foregoing, there is a technique disclosed in Japanese Laid-Open Patent Publication S60-77542. In this technique, filters are arranged in parallel, tap coefficients corresponding to different phases are divided to calculate, and calculated results are multiplexed. According to the technique, it is possible to decrease a required operation speed, but it is necessary to increase the oversampling number or the number of parallel lines of filters to suppress the deterioration of reception performance, corresponding to which, the circuitry scale is increased.

As a technique for reducing the circuitry scale, the invention disclosed in U.S. Pat. No. 1,725,413 is known. The subject matter of the invention is using the symmetry of impulse response train, only storing coefficients corresponding to half an impulse train, and changing the order of reading. However, this technique is limited to a case of calculation using a single product-sum calculator. In other words, since it is required to calculate multiplication with variable coefficients, it is not possible to perform calculation faster than calculation with fixed coefficients.

Further, as another technique for reducing the circuitry scale, the invention disclosed in U.S. Pat. No. 2,100,608 is known. The invention uses input signals not subjected to band limitation, and therefore, is not applicable to a case of performing filtering on received signals with band limitation and thermal noises.

As described above, the conventional techniques do not implement both obtaining fast calculation in FIR filter and reducing the circuitry scale in a digital receiving apparatus.

DISCLOSURE OF INVENTION

It is an object of the present invention to provide a finite impulse response filter and digital signal receiving apparatus enabling fast calculation and reduced circuitry scale.

A subject matter of the present invention is that a finite impulse response filter that receives its inputs digital signals is provided with N (N is a natural number) tap coefficient multipliers that are divided to two groups each with almost a half number of the multipliers, and that tap coefficients are set such that values between tap coefficients of adjacent multipliers of one multiplier group are set at values of generally even-symmetry to interpolate tap coefficients of the other multiplier group.

BEST MODE FOR CARRYING OUT THE INVENTION

Embodiments of the present invention will be described below with reference to accompanying drawings.

First Embodiment

Figure 1:
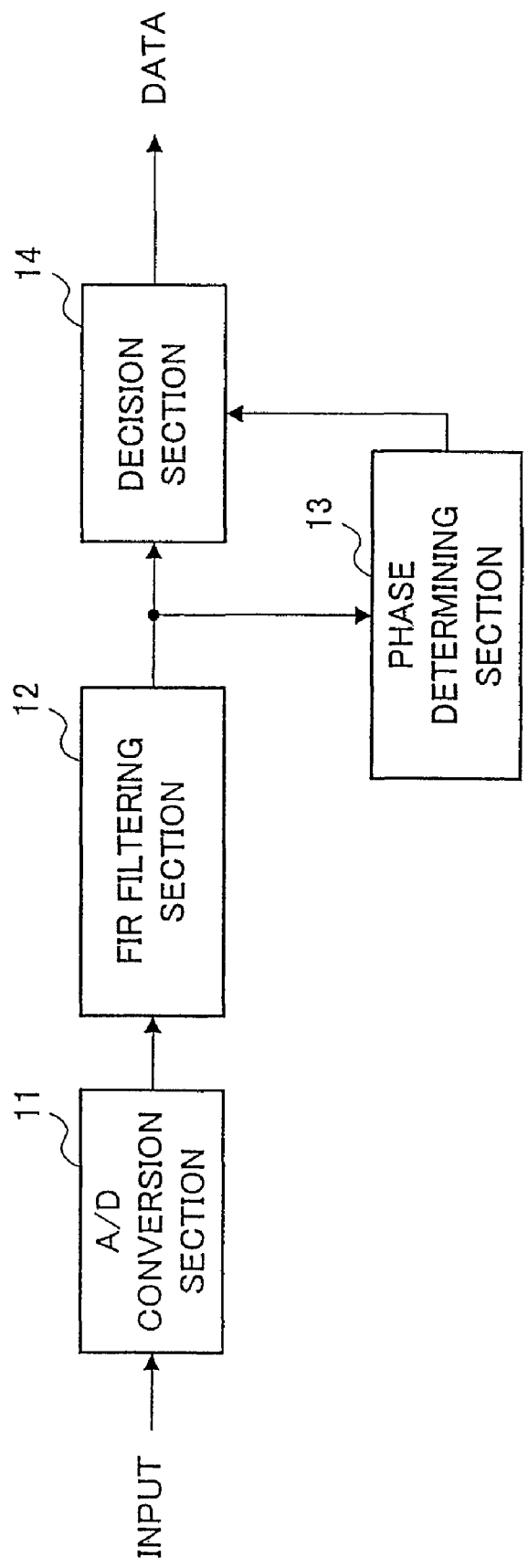
FIG. 1 is a block diagram illustrating a configuration of a conventional digital signal receiving apparatus.
Figure 2:
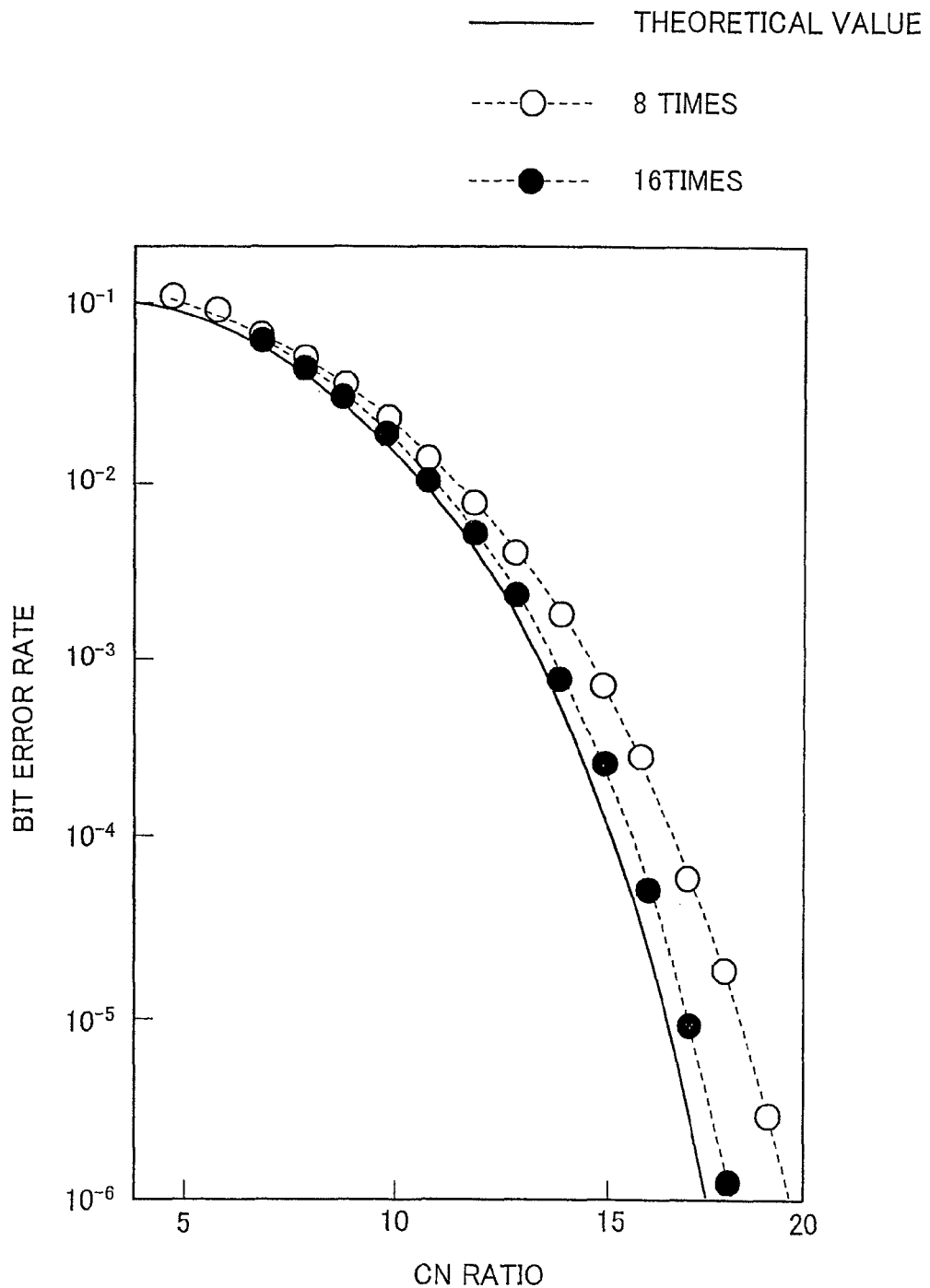
FIG. 2 is a graph illustrating the relationship between the oversampling number and reception performance.
Figure 3:
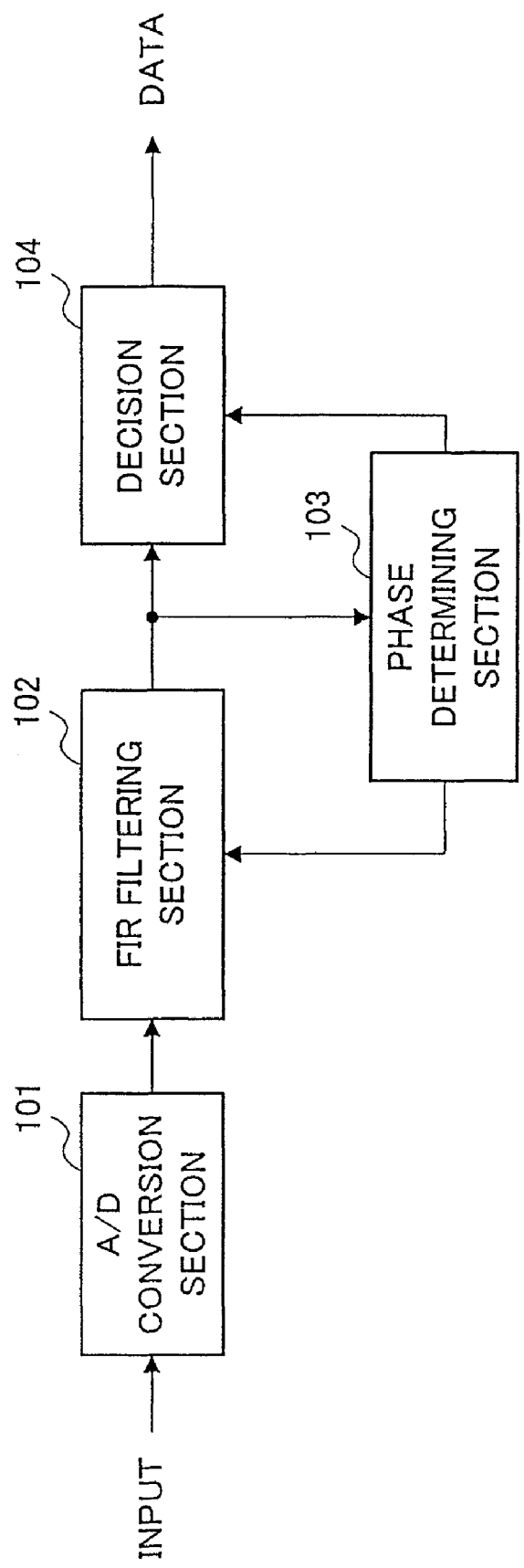
FIG. 3 is a block diagram illustrating a configuration of a digital signal receiving apparatus according to a first embodiment of the present invention.

FIG. 3 is a block diagram illustrating a configuration of a digital signal receiving apparatus according to the first embodiment of the present invention. As illustrated in FIG. 3, the digital signal receiving apparatus of this embodiment has A/D conversion section 101, FIR filtering section 102, phase determining section 103, and decision section 104. Configurations of the sections will be described specifically below.

A/D conversion section 101 performs oversampling on a received signal that is an analog signal at a rate M (M is an even number of two or more) times the symbol rate to convert into a digital signal. The digital signal is output to FIR filtering section 102.

FIR filtering section 102 has two delay-element sequences each composed of a plurality of delay elements. In the two delay-element sequences, input signals are sent in respective different directions, i.e., forward direction and reverse direction. The delay direction of input signal can be switched, and according to a finite impulse response train having such delay-element sequences, convolutional calculation is performed. This calculation is called filtering. A signal delayed in the forward direction and signal delayed in the reverse direction are alternately output to phase determining section 103 and decision section 104. In addition, the delay direction of input signal is switched based on a signal output from phase determining section 103. FIR filtering section 102 is explained specifically later.

Among signals output from FIR filtering section 102, phase determining section 103 compares oversampled phases with one another, only selects a phase (hereinafter referred to as an optimal phase) with less deterioration in reception performance, and outputs information of the selected phase to decision section 104. Further, the section 103 outputs information of the delay direction (the forward direction or the reverse direction) corresponding to the selected phase to FIR filtering section 102 as a switching signal. Phase determining section 103 is explained specifically later.

Based on the phase output from phase determining section 103, decision section 104 makes a decision on the signal filtered in FIR filtering section 102, and generates bit data.

Figure 4:
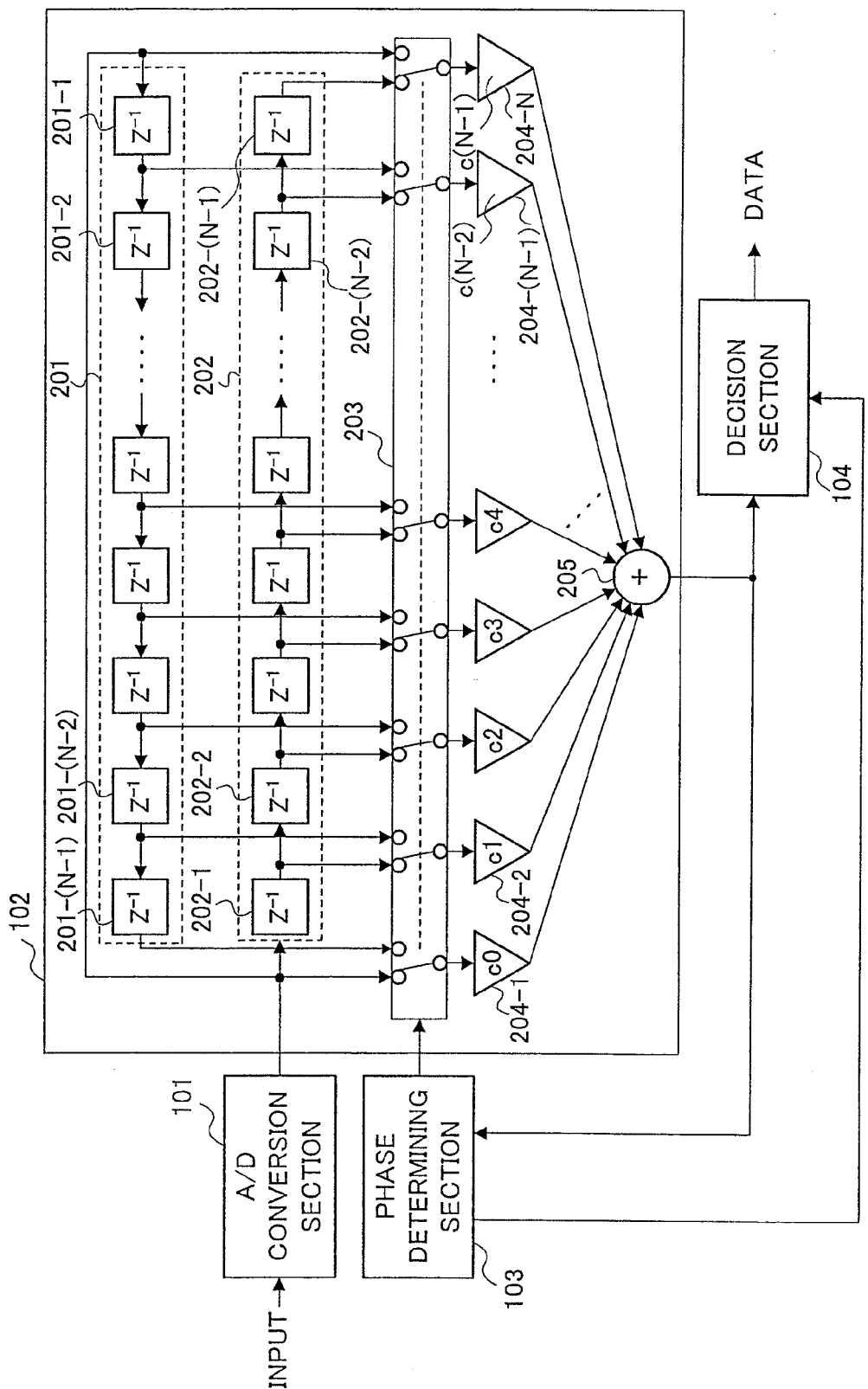
FIG. 4 is a block diagram illustrating an internal configuration of an FIR filtering section according to the first embodiment of the present invention.

FIR filtering section 102 will be described specifically below with reference to FIG. 4. FIG. 4 is a block diagram illustrating an internal configuration of FIR filtering section 102 according to the first embodiment of the present invention. FIR filtering section 102 has forward delaying section 201, reverse delaying section 202, switching section 203, tap-coefficient multipliers 204-1 to 204-N and adder 205. Configurations thereof will be described specifically below.

Forward delaying section 201 is composed of N−1 (N is a natural number) delay elements 201-1 to 201-(N−1) in series. Delay elements 201-1 to 201-(N−1) each delay an output signal from A/D conversion section 101 in the forward direction by a cycle of sampling, while outputting to switching section 203.

Reverse delaying section 202 is composed of N−1 delay elements 202-1 to 202-(N−1) in series. Delay elements 202-1 to 202-(N−1) each delay an output signal from A/D conversion section 101 in the reverse direction by a cycle of sampling, while outputting to switching section 203.

Switching section 203 has N switches, and each switch corresponds to respective output lines from delay elements 201-1 to 201-(N−1) and delay elements 202-1 to 202-(N−1). Corresponding to direction switching signal from phase determining section 103, switching section 203 switches between outputs from forward delaying section 201 and reverse delaying section 202 to output to tap-coefficient multipliers 204-1 to 204-N.

Tap-coefficient multipliers 204-1 to 204-N have predetermined tap coefficients $c_0$ to $c(N-1)$ respectively, and connected to respective switches in switching section 203. Signals output from switching section 203 are multiplied by respective tap coefficients in respective multipliers and output to adder 205.

Adder 205 adds all the outputs from tap-coefficient multipliers 204-1 to 204-N to output to decision section 104 and phase determining section 103.

Figure 5:
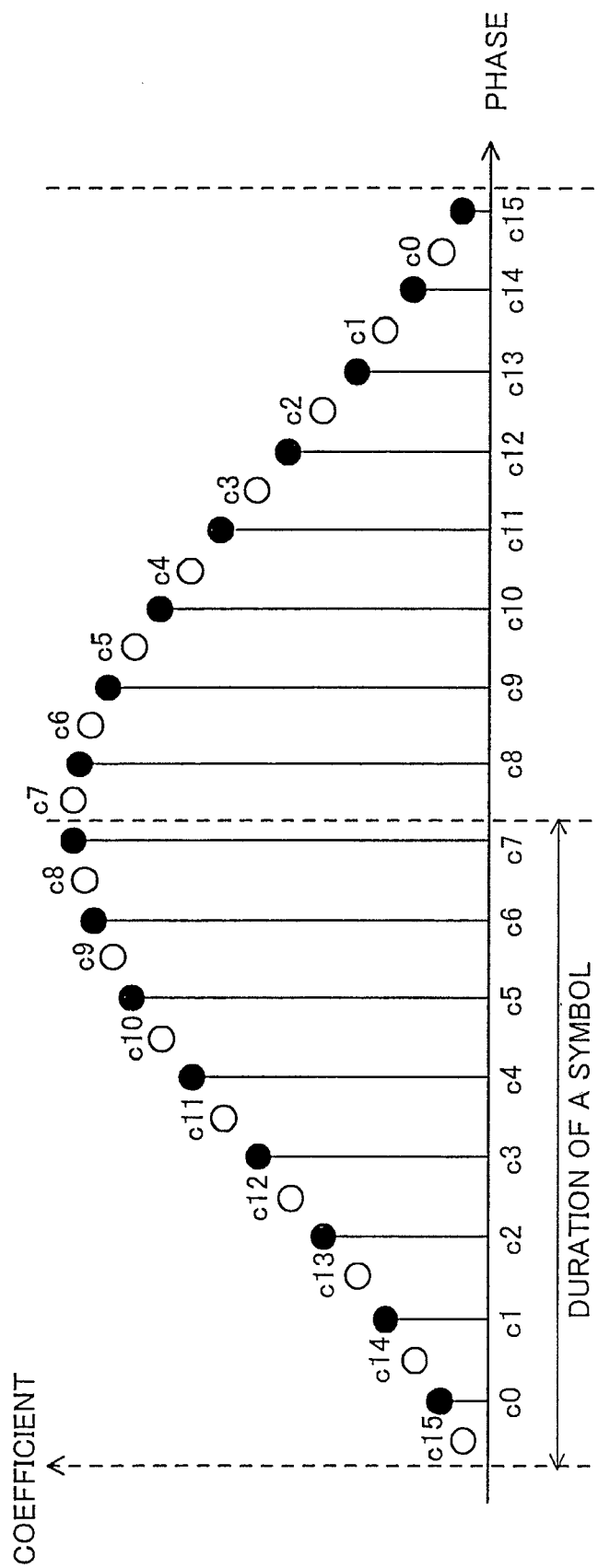
FIG. 5 is a view illustrating tap coefficients of a filter of linear phase.

A method will be described below of determining tap coefficients of tap-coefficient multipliers 204-1 to 204-N. FIG. 5 is a view illustrating tap coefficients of a filter of linear phase. In FIG. 5, the vertical axis indicates value of tap coefficient, and the horizontal axis indicates phase in 16 tap coefficients. Each black circle is a tap coefficient to multiply by a signal delayed in the forward direction, and each white circle is a tap coefficient to multiply by a signal delayed in the reverse direction. In addition, actually, black and white circles indicate the same tap coefficients. Herein, for example, noting black circles, $c_{15}$ is set at a minimum tap coefficient, and tap coefficients of $c_{14}$ to $c_8$ are set to increase stepwise. $c_7$ is set at a maximum tap coefficient. $c_6$ to $c_0$ are set to interpolate tap coefficients of $c_8$ to $c_{15}$.

When signals delayed in the forward direction and signals delayed in the reverse direction are input at predetermined timings to the tap-coefficient multipliers set for the tap coefficients as described above, it is possible to obtain filter characteristics equal to a case of using a doubled number of tap-coefficient multipliers. Specifically, noting the duration of a symbol, there are eight black circles (forward direction) and eight white circles (reverse direction). Thus oversampled signals at a rate 8 times the symbol rate correspond to 16-times oversampling. In other words, when these filter characteristics are implemented with a nyquist filter generally used in radio communications, even-symmetric 32 tap coefficients are required. Accordingly, since FIR filtering section 102 of this embodiment is set for 16 tap coefficients, half the number of tap coefficient multipliers are only required as compared to the conventional nyquist filter.

FIR filtering section 102 set for such tap coefficients obtains a moving average of digital signals subjected to A/D conversion. Further, since tap-coefficient multipliers that cause increases in circuitry scale are set for fixed coefficients, it is possible to reduce the circuitry scale. When the sampling rate of A/D conversion section 101 is M times the symbol rate, it is possible to perform the high-rate calculation operation corresponding to 2M-times oversampling with low power consumption.

In addition, while FIG. 5 illustrates the case of 16 tap coefficients, the filtering section may be configured using N (N is a natural number) tap coefficients in the same way.

Figure 6:
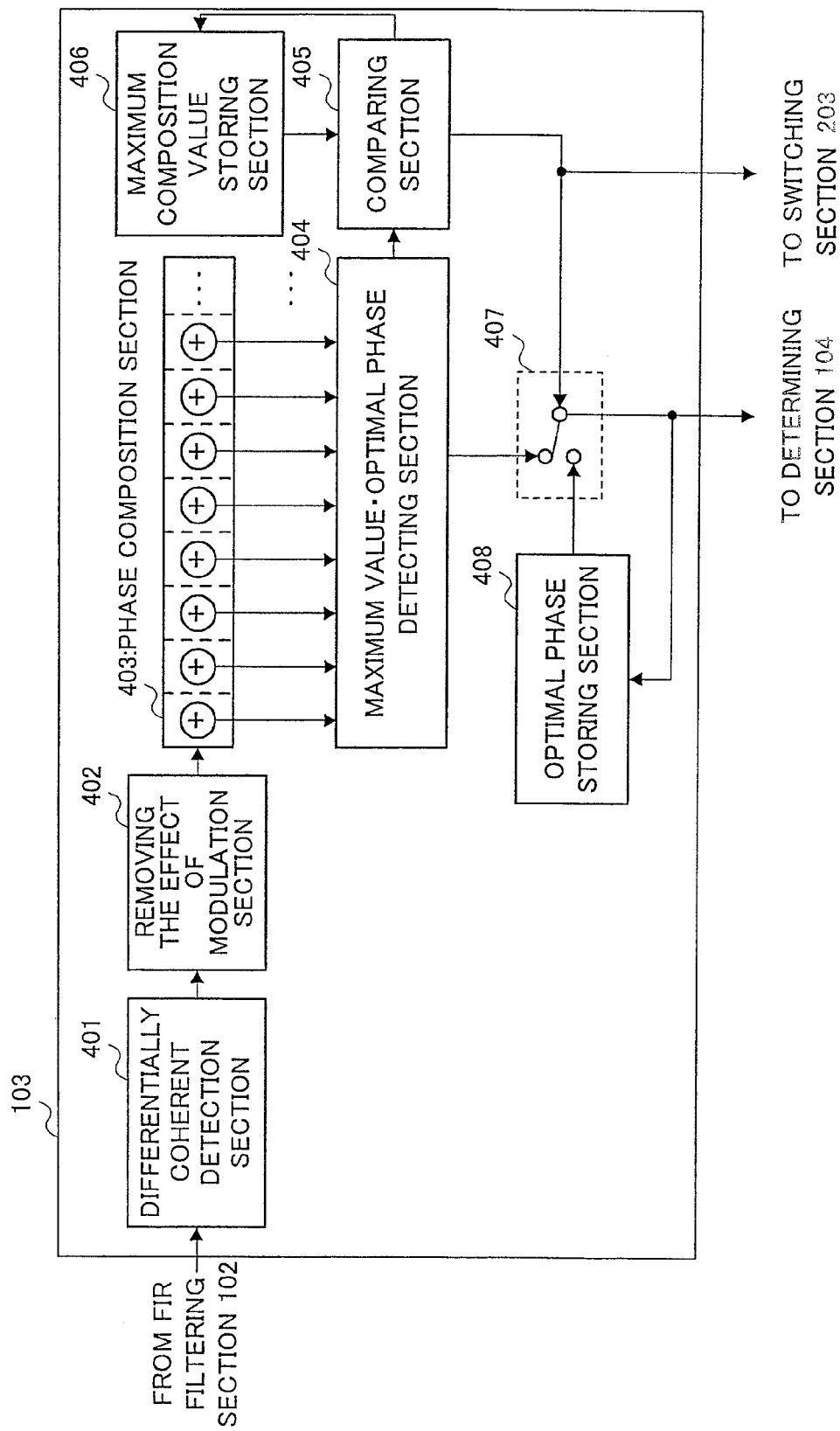
FIG. 6 is a block diagram illustrating an internal configuration of a phase determining section in the first embodiment of the present invention.

Phase determining section 103 will be described specifically below with reference to FIG. 6. FIG. 6 is a block diagram illustrating an internal configuration of phase determining section 103 according to the first embodiment of the present invention. Phase determining section 103 has differentially coherent detection section 401, removing the effect of modulation section 402, phase composition section 403, maximum value•optimal phase detecting section 404, comparing section 405, maximum composition value storing section 406, optimal phase switching section 407, and optimal phase storing section 408. Configurations of the sections will be described specifically below.

Differentially coherent detection section 401 removes an initial phase from a signal output from FIR filtering section 102 by differentially coherent detection to output to removing the effect of modulation section 402. Removing the effect of modulation section 402 removes a modulation component from the output signal from the section 401 to output to phase composition section 403. In addition, methods of removing modulation components include performing inverse-modulation, squaring, or conjugate coupling with a known signal on a provisional decision signal.

Phase composition section 403 performs vector composition on output signals from removing the effect of modulation section 402 by a number of phases corresponding to phase accuracy required to meet predetermined characteristics. The composition result on each phase is output to maximum value•optimal phase detecting section 404.

Maximum value•optimal phase detecting section 404 detects a maximum composition value signal indicative of a maximum value and a phase signal indicative of a phase of the maximum value from among composition results output from phase composition section 403. The maximum composition value is of a signal with the least deterioration in reception performance, and a phase corresponding to the maximum composition value is the optimal phase. The maximum composition value signal is output to comparing section 405, and the phase signal is output to optimal phase switching section 407.

Comparing section 405 compares the maximum composition value output from maximum value•optimal phase detecting section 404 with a signal stored in maximum composition value storing section 406. As a result of the comparison, when the signal stored in the section 406 is larger, comparing section 405 outputs a signal for switching the delay direction of signal in FIR filtering section 102 as a Low signal. Meanwhile, when the signal stored in the section 406 is smaller, the section 405 outputs a signal for switching the direction as a High signal, and further outputs a maximum composition value signal to the section 406. The Low signal and High signal are output to optimal phase switching section 407 and switching section 203.

Maximum composition value storing section 406 outputs a stored maximum composition value signal to comparing section 405 whenever the section 404 outputs a maximum composition value signal to comparing section 405. As a result of the comparison in comparing section 405, when the maximum composition value signal from the section 404 is larger, the section 406 updates the stored data to the maximum composition value signal. As a result of the comparison in comparing section 405, when the value stored in the section 406 is larger, the section 406 does not update the stored data.

Based on the direction switching signal from comparing section 405, optimal phase switching section 407 selects either an output signal from the section 404 or output signal from optimal phase storing section 408. For example, when the direction switching signal is the High signal, the section 407 selects a phase signal output from the section 404. Meanwhile, when the direction switching signal is the Low signal, the section 407 selects an output signal from the section 408. The signal selected in the section 407 is output to decision section 104 and optimal phase storing section 408.

Whenever a signal selected in optimal phase switching section 407 is output, optimal phase storing section 408 updates the stored data. In addition, a phase stored in optimal phase storing section 408 corresponds to a phase of the maximum composition value stored in maximum composition value storing section 406.

Switching of switching section 203 by comparing section 405 will be described below. When a direction switching signal output from comparing section 405 is the High signal, a maximum composition value signal output from maximum value•optimal phase detecting section 404 is larger than a signal stored in maximum composition value storing section 406. In other words, the maximum composition value is detected in the current delay direction, and therefore, the delay direction is not switched at the time of High signal. Meanwhile, at the time of Low signal, since a composition value larger than the previous maximum composition value is not detected in the current delay direction, switching section 203 switches the delay direction.

Phase determining section 103 with the aforementioned configuration switches to a filter structure capable of extracting an optimal phase, and therefore, it is possible to improve decision accuracy of signal and to implement reception with high performance.

Figure 7:
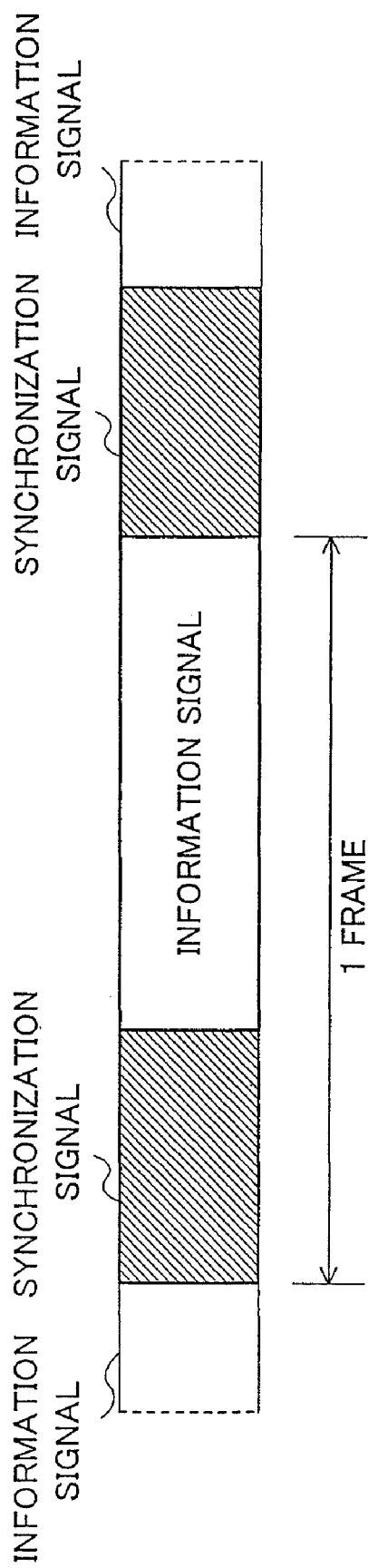
FIG. 7 is a view illustrating a signal format according to the first embodiment of the present invention.

A signal format will be described with reference to FIG. 7 which is used in the digital signal receiving apparatus according to this embodiment. FIG. 7 is a view illustrating a signal format according to the first embodiment of the present invention.

As illustrated in FIG. 7, a synchronization signal for use in phase determination and information signal are time-wise divided and configured. Since a clock frequency error is present between transmitting side and receiving side in radio communications, etc., it is required for the receiving side to always determine an optimal decision phase to follow the transmitting side. A known synchronization signal provided at the beginning of a frame is used to determine a decision phase, and the decision phase can be determined with accuracy from the synchronization signal of short sequence. In this way, when a clock frequency error between transmitting side and receiving side is large, it is possible to suppress decreases in transmission efficiency due to the synchronization signal that needs to be inserted periodically and frequently, to a minimum.

Moreover, when a signal of the same predetermined sequence is repeated and configured as the synchronization signal, the signal of the same sequence undergoes filtering repeatedly, and thus the accuracy in phase determination is improved. Switching section 203 switches delay directions whenever the signal of the same sequence is repeatedly input to FIR filtering section 102, resulting in a filter structure capable of determining a decision phase prior to the processing of information signal.

Further, it is preferable that phase composition section 403 illustrated in FIG. 4 performs the processing for a period of time during which the synchronization signal is transmitted.

Furthermore, it is preferable to provide a time interval between the synchronization signal and information signal in consideration of transition state of the filter. It is because the decision can be made on the information signal after the transition state of the filter caused by switching in switching section 203 is stabilized to the steady state, and thus, errors tend not to occur.

When the synchronization signal is a known modulation signal and mapped onto a signal point with a maximum signal distance, such a signal has resistance to effects of thermal noises and frequency errors generated in a radio demodulation section disposed at a stage prior to the present invention, and it is thereby possible to determine an optimal decision phase with accuracy and implement reception with high performance. For example, by removing the initial phase in the differentially coherent detection section and further removing the modulation component in the removing the effect of modulation section, the synchronization signal is mapped on one of ideal signal points when there are no frequency error and thermal noise. For example, the signal point is one on the in-phase axis in the case of BPSK modulation signal. When there is a frequency error, the signal point is one rotated in the quadrature axis direction. When there is a thermal noise, the signal is dispersed and mapped around an ideal point as a center.

Figure 8:
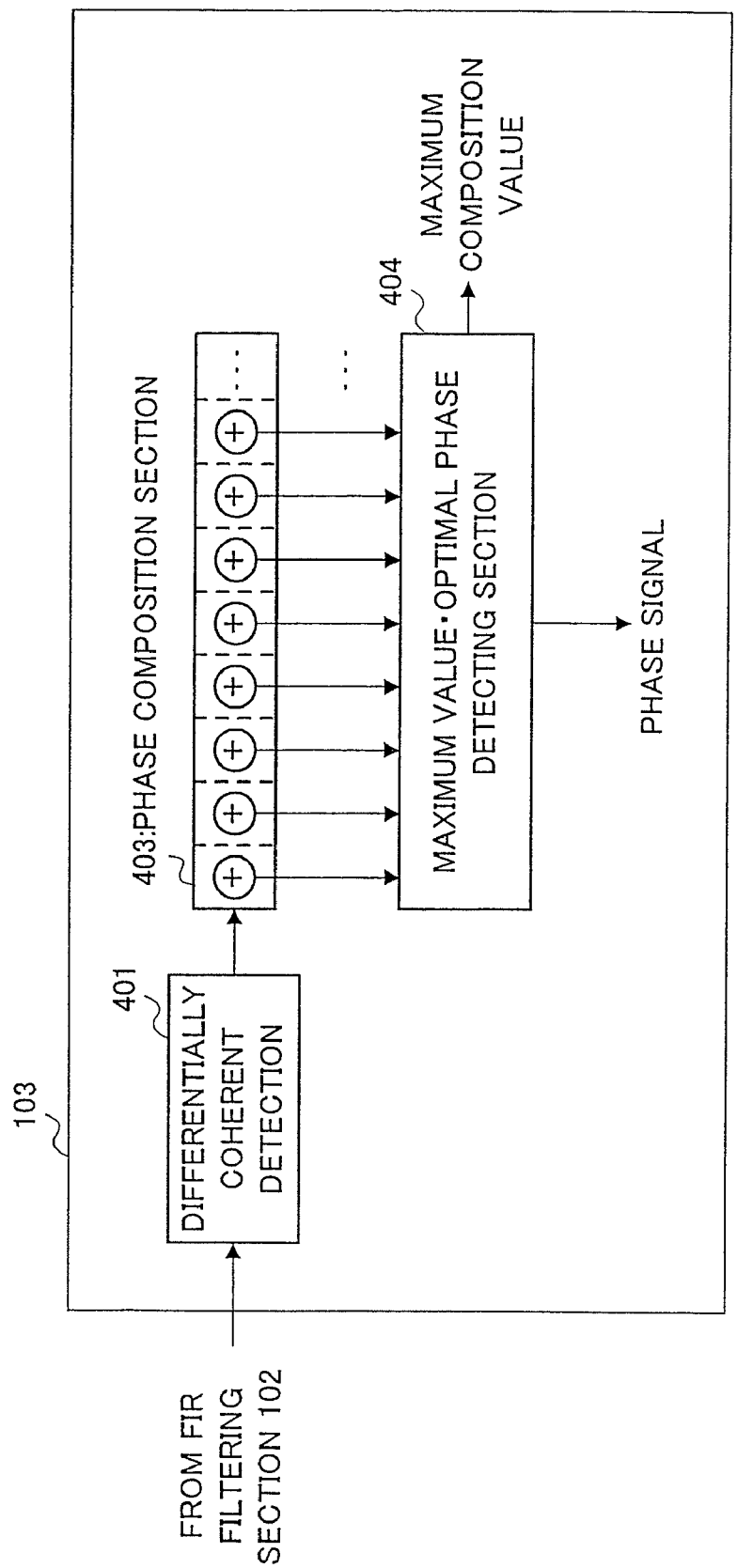
FIG. 8 is a block diagram illustrating another internal configuration of a phase determining section in the first embodiment of the present invention.

When the synchronization signal is a sequence of known modulation signals, phase determining section 103 has a configuration as illustrated in FIG. 8. In other words, differentially coherent detection section 401 is capable of outputting signals to phase composition section 403, and the removing the effect of modulation section can be eliminated. For example, in the case where the synchronization signal is a BPSK modulation signal and its signal sequence is a repeated sequence of "1" and "0", since the initial phase and modulation component are removed by differentially coherent detection, the signal point is one of ideal signal points when there are no frequency error and thermal noise. The signal point is one on the in-phase axis in the case of BPSK modulation signal.

Thus, according to this embodiment, the FIR filter is provided in which tap coefficients are fixed and which performs filtering while switching the delay direction of input signal between the forward direction and reverse direction, and based on a phase of a signal with less deterioration among filtered signals, the decision is made on a signal, whereby it is possible to reduce the circuitry scale and to perform calculation at high speed. In this way, it is possible to implement a device with reduced power consumption and with inexpensive cost even when high-symbol-rate signals are demodulated.

In addition, the synchronization signal is not limited to a BPSK modulation signal, and the same effects may be obtained using a QPSK modulation signal or QAM modulation signal.

Second Embodiment

Figure 9:
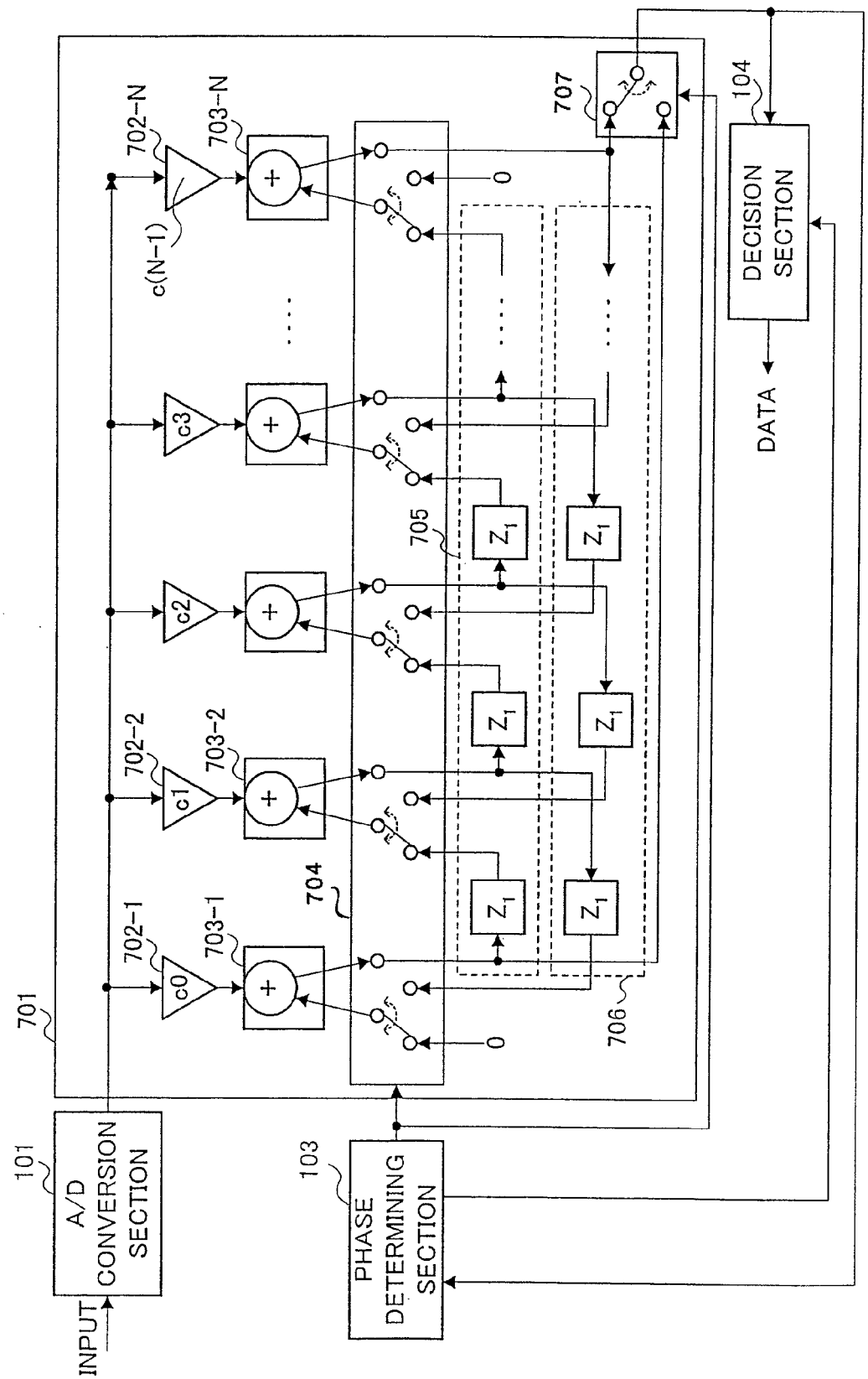
FIG. 9 is a block diagram illustrating a configuration of a digital signal receiving apparatus according to a second embodiment of the present invention.

FIG. 9 is a block diagram illustrating a configuration of a digital signal receiving apparatus according to the second embodiment of the present invention. In addition, in FIG. 9, the sections common to FIG. 3 are assigned the same reference numerals as in FIG. 3, and specific descriptions thereof are omitted. FIG. 9 illustrates a transposition type of FIR filtering section 701 instead of a direct type of FIR filtering section 102, and in this respect, differs from FIG. 3.

FIR filtering section 701 has N tap-coefficient multipliers 702-1 to 702-N, N adders 703-1 to 703-N, switching section 704, forward delaying section 705 having N−1 delay elements, reverse delaying section 706 having N−1 delay elements, and output signal switching section 707. Configurations thereof will be described specifically below.

Tap-coefficient multipliers 702-1 to 702-N multiply signals output from A/D conversion section 101 by predetermined tap coefficients (c0 to c(N−1)) to output to adders 703-1 to 703-N, respectively.

Adders 703-1 to 703-N add respective output signals from tap-coefficient multipliers 702-1 to 702-N and an output signal from switching section 704. The addition results are output to forward delaying section 705 and reverse delaying section 706.

Switching section 704 has N switches, and each switch switches between outputs from forward delaying section 705 and from reverse delaying section 706 to output to respective one of adders 703-1 to 703-N. Each switch further outputs a signal output from respective one of adders 703-1 to 703-N to forward delaying section 705 and reverse delaying section 706. Switching of each switch is performed based on an output signal from phase determining section 103. In addition, two switches corresponding to tap coefficients c0 and c(N−1) as illustrated in FIG. 9 switch between a delayed signal and 0 signal.

Forward delaying section 705 and reverse delaying section 706 delay added signals from adders 703-1 to 703-N to output to switching section 704.

Output signal switching section 707 outputs either added signal of adder 703-1 or 703-N respectively corresponding to c0 and c(N−1) as illustrated in FIG. 9 to decision section 104 and phase determining section 103. Either added signal is output based on an output signal of phase determining section 103.

FIR filtering section 701 is modified from direct type of FIR filtering section 102 to transposition type, differs from the section 102 in processing process, and performs calculation in the same as in the section 102.

Thus, according to this embodiment, by substituting the transposition type of FIR filtering section for the direct type of FIR filtering section as illustrated in the first embodiment, adders 703-1 to 703-N are capable of performing calculation at high speed, and the circuitry scale can be further reduced.

Third Embodiment

Figure 10:
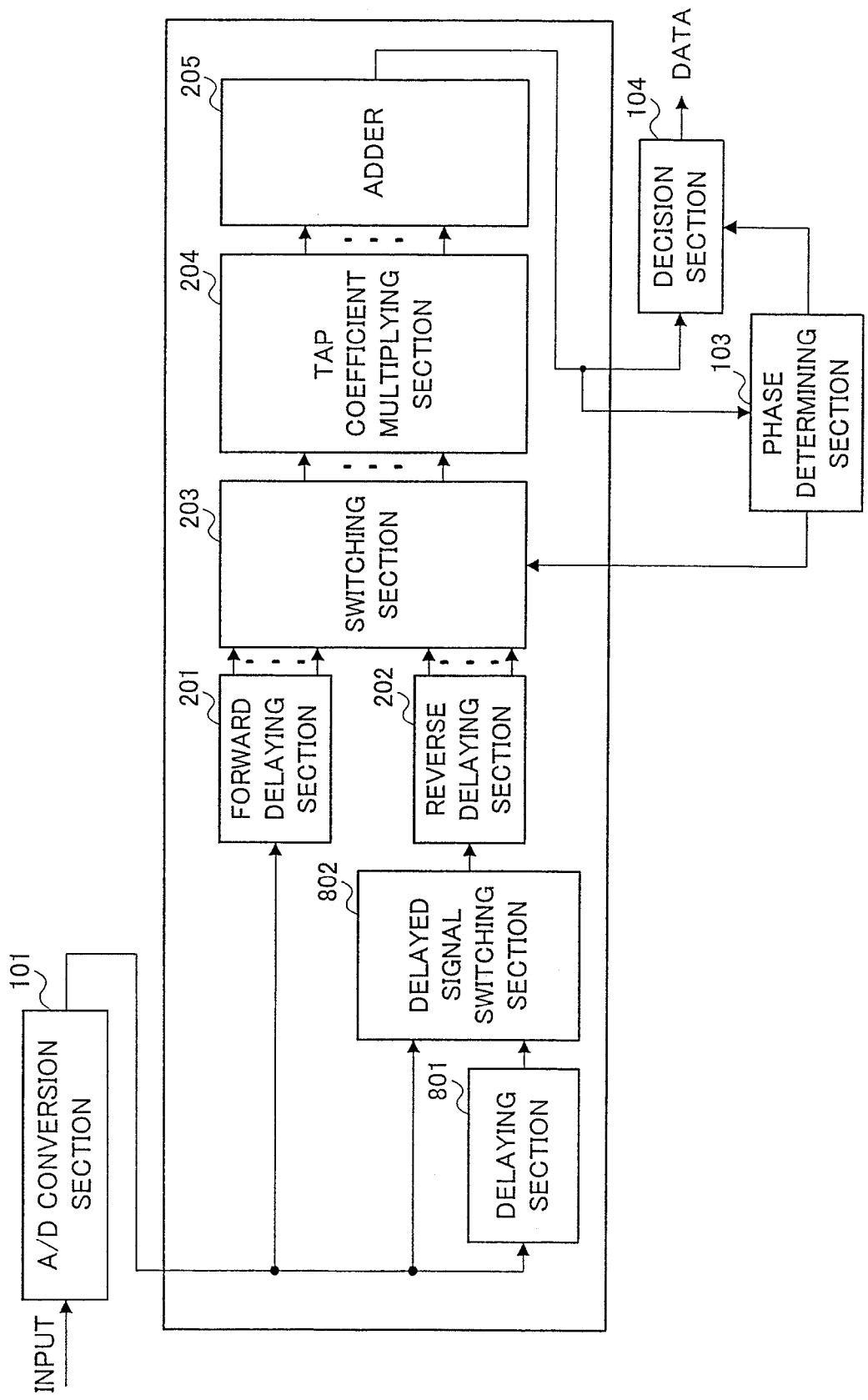
FIG. 10 is a block diagram illustrating a configuration of a digital signal receiving apparatus according to a third embodiment of the present invention.

FIG. 10 is a block diagram illustrating a configuration of a digital signal receiving apparatus according to the third embodiment of the present invention. In addition, in FIG. 10, the sections common to FIG. 3 are assigned the same reference numerals as in FIG. 3, and specific descriptions thereof are omitted. FIG. 10 illustrates FIR filtering section 800 instead of FIR filtering section 102, and in this respect, differs from FIG. 3.

FIR filtering section 800 has delaying section 801 and delayed signal switching section 802 in addition to the configuration of FIR filtering section 102. These sections are primarily explained.

Delaying section 801 delays an output signal of A/D conversion section 101 by predetermined time to output to delayed signal switching section 802. It is assumed herein that the predetermined time is KM times the symbol rate when the number of symbols of the synchronization signal is K and the oversampling number in A/D conversion section 101 is M.

Delayed signal switching section 802 switches between output signals from A/D conversion section 101 and from delaying section 801 at intervals KM times the symbol rate during a period of time the synchronization signal is input, and outputs the signal to reverse delaying section 202.

Figure 11:
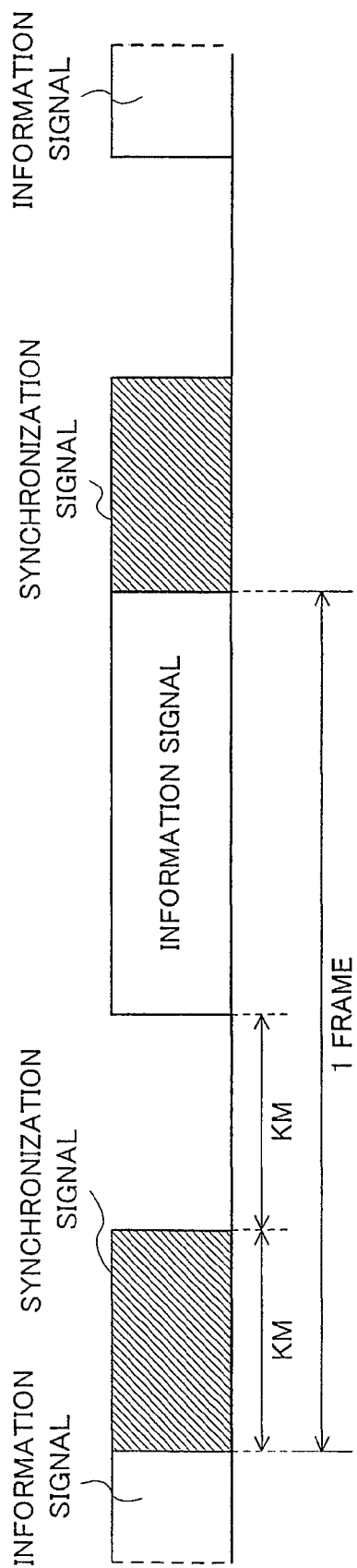
FIG. 11 is a view illustrating a signal format in the third embodiment of the present invention.

A signal format will be described below that is used in the aforementioned configuration. FIG. 11 is a view illustrating a signal format in the third embodiment of the present invention. As illustrated in FIG. 11, one frame is composed of a synchronization signal and information signal, and a null signal is inserted between the synchronization signal and information signal. The null signal is set for the same duration as that of the synchronization signal. For example, when the synchronization signal is inserted for a duration of time KM times the symbol rate, the null signal is also inserted for the duration of time KM times the symbol rate. It is thereby possible to suspend the operation required to switch switching section 203 during a period of time the null signal is inserted, enabling reduced power consumption.

When the signal format as illustrated in FIG. 11 is applied to FIR filtering section 800 as illustrated in FIG. 10, forward delaying section 201 performs the forward filtering on the synchronization signal without delay. Subsequently, reverse delaying section 202 performs the reverse filtering on the synchronization signal that is delayed in delaying section 801 by a time KM times the symbol rate. It is thus possible to determine an optimal phase without using a synchronization signal inserted into a different frame. When a phase obtained by the reverse filtering is optimal, delayed signal switching section 802 outputs a signal output from A/D conversion section 101 to reverse delaying section 202, whereby it is possible to perform filtering without delaying an information signal. Further, it is possible to determine a decision phase with high accuracy in consideration of the forward direction and reverse direction without inserting synchronization signals repeatedly into one frame, and the reception performance is thus improved.

As described in the first embodiment, it is preferable to provide a time interval between the synchronization signal and information signal in consideration of transition state of the filter. It is thereby possible for decision section 104 to make a decision on the information signal after the transition state of the filter caused by switching in switching section 203 is stabilized to the steady state, and therefore, error generation is suppressed.

Thus, according to this embodiment, by delaying the same synchronization signal inserted to a frame in forward and reverse directions, it is possible to determine a decision phase faster and with higher accuracy.

In addition, since a synchronization signal with the same symbol patter is transmitted a plurality of times, a decision phase is determined using the synchronization signal with the same symbol patter, and it is thus possible to determine a decision phase with high accuracy. As a result, it is possible to improve the reception performance.

Fourth Embodiment

This embodiment explains a case of estimating an optimal decision phase in consideration of the forward filtering and reverse filtering from either delay direction (for example, output of the forward filtering).

Figure 12:
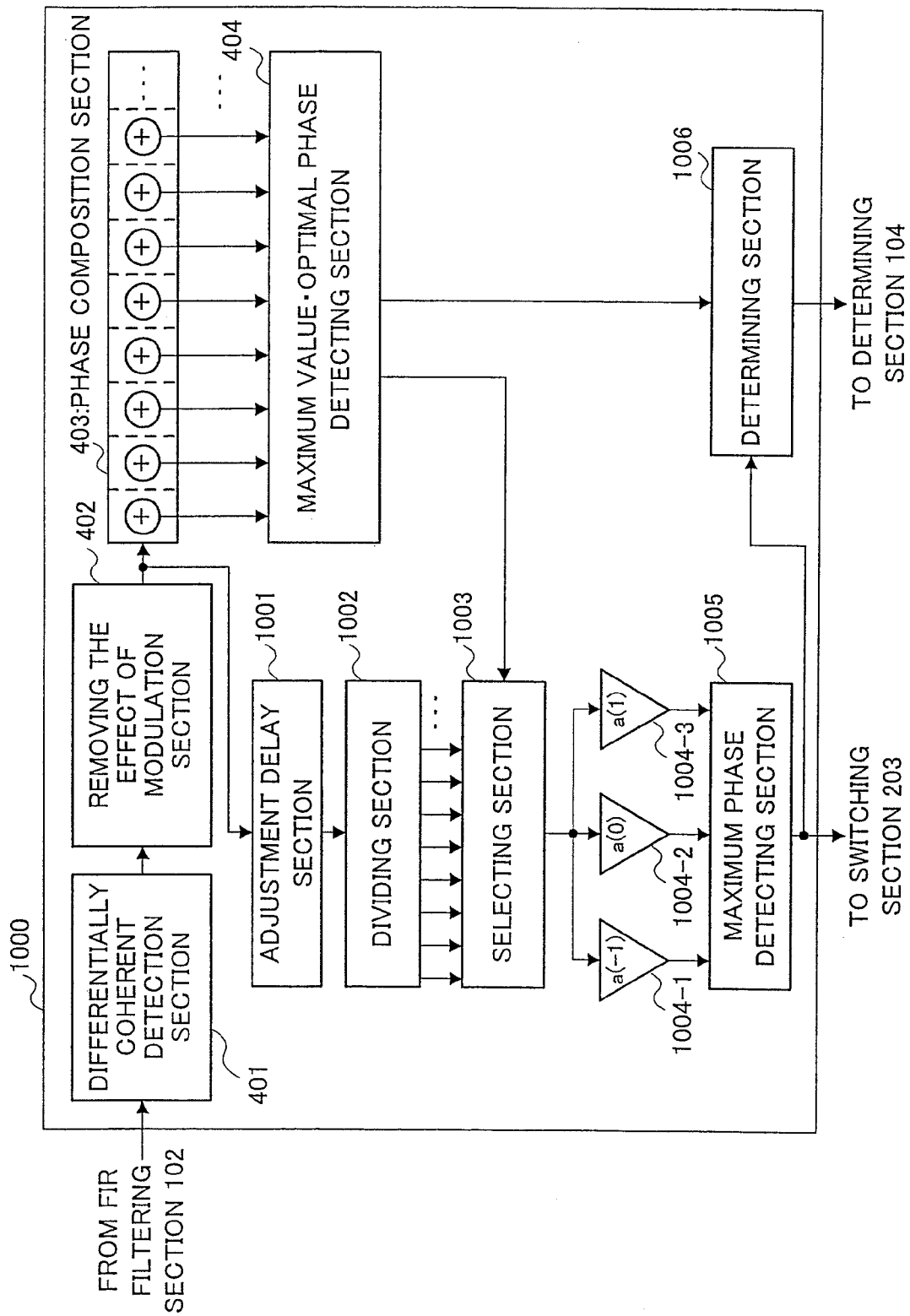
FIG. 12 is a block diagram illustrating an internal configuration of a phase determining section in a fourth embodiment of the present invention.

FIG. 12 is a block diagram illustrating an inner configuration of phase determining section 1000 in the fourth embodiment of the present invention. In addition, in FIG. 12, the sections common to FIG. 6 are assigned the same reference numerals as in FIG. 6, and specific descriptions thereof are omitted. FIG. 12 illustrates adjust delay section 1001, dividing section 1002, selecting section 1003, multipliers 1004-1 to 1004-3 respectively set for coefficients a(−1), a(0) and a(1), maximum phase detecting section 1005 and determining section 1006 in addition to the basic configuration in FIG. 6, and in this respect, differs from FIG. 6. Configurations thereof will be described specifically below.

Removing the effect of modulation section 402 removes the modulation component from a signal output from differentially coherent detection section 401 to output to phase composition section 403 and adjust delay section 1001.

Adjust delay section 1001 delays a signal output from removing the effect of modulation section 402 by a processing time in phase composition section 403 and maximum value·optimal phase detecting section 404 to output to dividing section 1002.

Dividing section 1002 divides the signal output form adjust delay section 1001 to phase components (converts a serial signal into parallel signals) to output to selecting section 1003.

Selecting section 1003 selects signals from among output signals from dividing section 1002 using a maximum composition value signal of the section 404 to output to multipliers 1004-1 to 1004-3.

Multipliers 1004-1 to 1004-3 multiply output signals from selecting section 1003 by predetermined respective coefficients to output to maximum phase detecting section 1005.

The coefficients used in multipliers 1004-1 to 1004-3 are assumed to be an ideal value (a(0)) obtained by removing the modulation component after performing differentially coherent detection with respect to an optimal phase and ideal values (a(−1) and a(1)) obtained by removing the modulation component after performing differentially coherent detection with respect to two phases adjacent the optimal phase among phases subjected to oversampling. In this way, the processing in multipliers 1004-1 to 1004-3 equals to calculating the correlation with the ideal value. When a phase of the signal selected in selecting section 1003 is optimal, an output multiplied by coefficient a(0) is maximum. In the other hands, when either output multiplied by coefficient a(−1) or a(1) is maximum, it is understood that a decision phase is detected to switch the delay direction in FIR filtering section 102 disposed before the sections 1004-1 to 1004-3.

Maximum phase detecting section 1005 detects a maximum signal from among output signals of multipliers 1004-1 to 1004-3. When a detection result is a(0), the delay directions in not varied. Meanwhile, when a detection result is a(1) or a(−1), the section 1005 outputs a signal for switching the delay direction to switching section 203 and determining section 1006. In this way, a filter structure is obtained which allows to a decision phase to be determined with accuracy, and it is thus possible to improve decision accuracy of information signal.

Determining section 1006 determines the direction in which a signal is currently input to the FIR filter from the phase signals from the sections 1005 and 404, and outputs a direction determination signal to decision section 104.

Further, determining section 1006 is capable of determining a decision phase in the filter to be obtained in the direction opposite to the input direction, using an output signal from the section 404 and whether an output signal from the 1005 is of coefficient a(−1) or a(1).

In other words, in either case that the delay direction is forward or reverse, when maximum phase detecting section 1005 detects coefficient a(0), an optimal phase signal detected in maximum value optimal phase detecting section 404 becomes a decision phase. Meanwhile, when coefficient a(−1) is detected, a phase shifted in the negative direction with respect to the optimal phase detected in the section 404 becomes a decision phase. Further, when coefficient a(1) is detected, a phase shifted in the positive direction with respect to the optimal phase detected in the section 404 becomes a decision phase.

Thus, according to this embodiment, without switching the direction in which a signal is input to the filter, it is possible to determine a decision phase with high accuracy using a synchronization signal with a shorter sequence, and it is thereby possible to suppress decreases in transmission efficiency.

Fifth Embodiment

Figure 13:
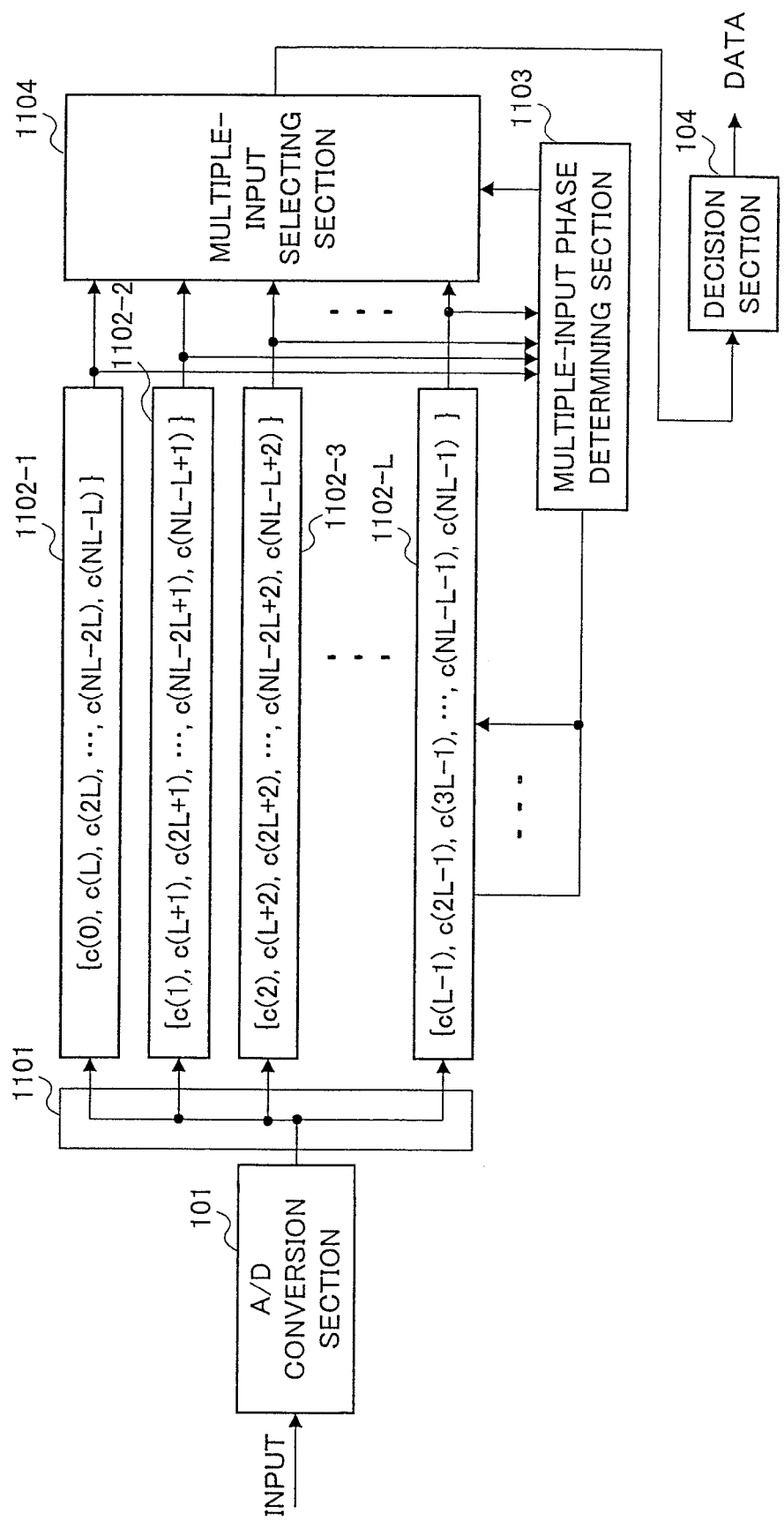
FIG. 13 is a block diagram illustrating a configuration of a digital signal receiving apparatus according to a fifth embodiment of the present invention.

FIG. 13 is a block diagram illustrating a configuration of a digital signal receiving apparatus according to the fifth embodiment of the present invention. In addition, in FIG. 13, the sections common to FIG. 3 are assigned the same reference numerals as in FIG. 3, and specific descriptions thereof are omitted. FIG. 13 illustrates L branching section 1101 that branches an output signal from A/D conversion section 101 to L signals, L FIR filtering sections, 1102-1 to 1102-L, provided in parallel, multiple-input phase determining section 1103 and multiple-input selecting section 1104 in addition to the basic configuration in FIG. 3, and in this respect, differs from FIG. 3. Descriptions thereof will be described specifically below.

L branching section 1101 branches an output signal form A/D conversion section 101 to L signals, and outputs a branched signal to each of FIR filtering sections 1102-1 to 1102-L that are disposed in parallel.

FIR filtering sections 1102-1 to 1102-L are set for different tap coefficients. Signals output from L branching section 1101 undergo filtering in respective filtering sections, and are output to multiple-input phase determining section 1103 and multiple-input selecting section 1104. By L-branching inputs to FIR filtering sections 1102-1 to 1102-L, it is possible to reduce a sampling rate required to A/D conversion section 1101 to 1/L times, and therefore, it is possible to execute processing on high-rate input signals without delays.

Multiple-input determining section 1103 performs differentially coherent detection on L filtered signals in L differentially coherent detection sections. L removing the effect of modulation sections remove modulation components from the signals subjected to the detection to output to the phase composition section.

The processing in the phase composition section and subsequent sections is the same as described in the first and fourth embodiments, and an optimal phase signal is determined. The determined optimal phase signal is output to multiple-input selecting section 1104. The direction switching signal is output to switching section 203 in L FIR filtering sections, 1102-1 to 1102-L.

Multiple-input selecting section 1104 selects a filtered signal corresponding to a phase signal of multiple-input phase determining section 1103 from L filtered signals to output to decision section 104 as a filtered signal of optimal phase.

Thus, according to this embodiment, multipliers of large circuitry scale are set for fixed coefficients, thereby reducing the circuitry scale, and when A/D conversion section is set for an M/L-times sampling rate, the FIR filtering sections are capable of performing fast operation corresponding to 2M-times oversampling, thus enabling reduced power consumption and cost reduction.

Sixth Embodiment

Figure 14:
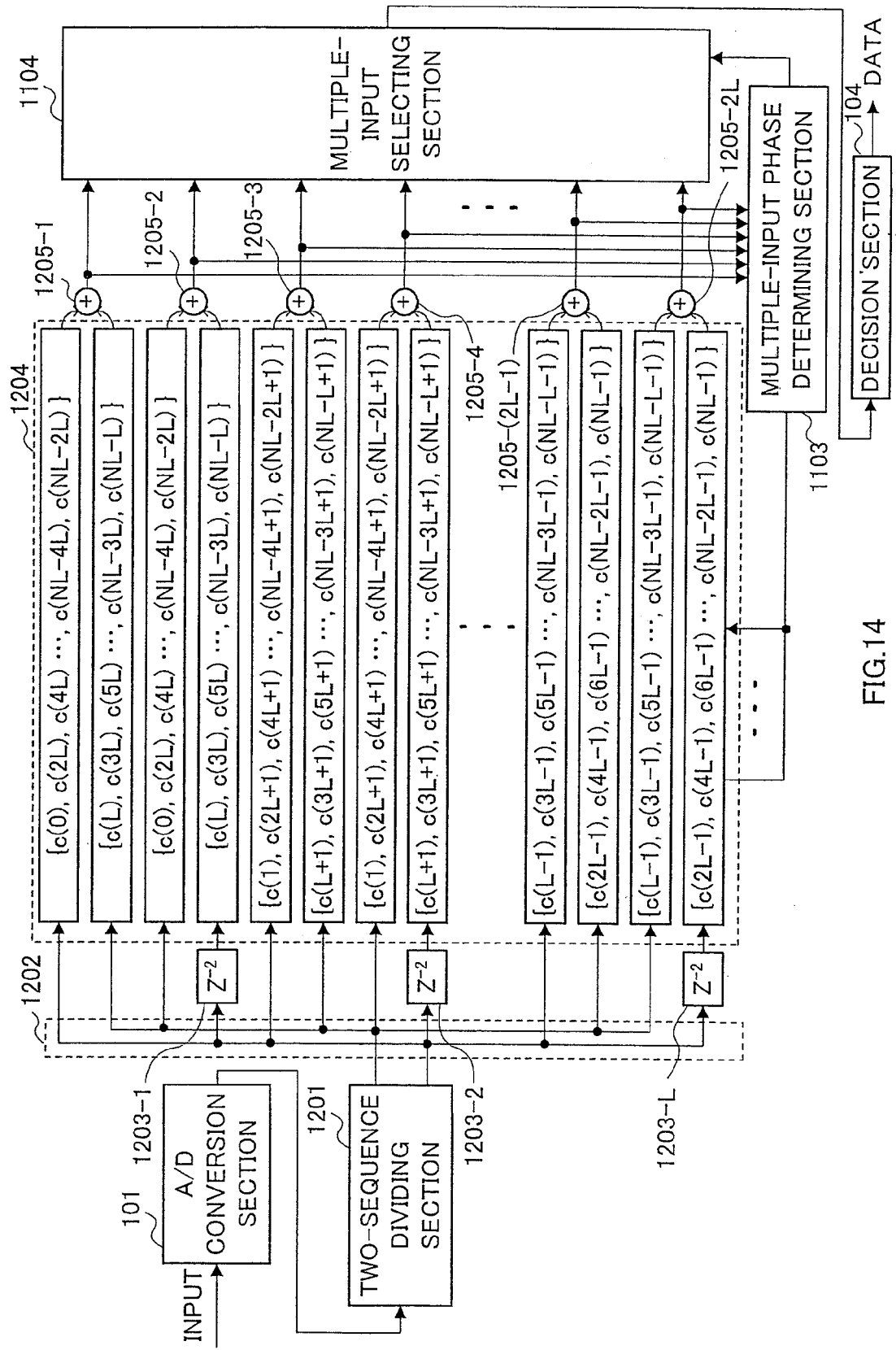
FIG. 14 is a block diagram illustrating a configuration of a digital signal receiving apparatus according to a sixth embodiment of the present invention.

FIG. 14 is a block diagram illustrating a configuration of a digital signal receiving apparatus according to the sixth embodiment of the present invention. In addition, in FIG. 14, the sections common to FIG. 13 are assigned the same reference numerals as in FIG. 13, and specific descriptions thereof are omitted. FIG. 14 illustrates two-sequence dividing section 1201, 4L branching section 1202, L delaying sections, 1203-1 to 1203-L, that delay a signal by a time 2M times the sampling rate in A/D conversion section 101, FIR filtering group 1204 having 4L FIR filters, and 2L adders, 1205-1 to 1205-2L in addition to the basic configuration in FIG. 13, and in this respect, differs from FIG. 13. Configurations thereof will be described specifically below.

Two-sequence dividing section 1201 divides an output signal from A/D conversion section 101 into two-sequence parallel signals to output to 4L branching section 1201.

4L branching section 1202 branches signals divided into two sequences to branches of 2L signals for each sequence, i.e., 4L signals. L signals are output to delaying sections 1203-1 to 1203-L, and 3L signals are output to FIR filtering group 1204.

Delaying sections 1203-1 to 1203-L delay L signals from 4L branching section 1202 corresponding to tap coefficients as illustrated in FIG. 14 by a time 2M times the sampling rate of A/D conversion section 101. The delayed signals are output to filters in FIR filtering group 1204 to which signals are not directly input from 4L branching section 1202.

In FIR filtering group 1204, as shown in FIG. 14, tap coefficients are {c(0), c(2L), . . . ,c(NL−2L)} and thus increased by 2L in the filter. Further, 2L kinds of filters are present where a first tap coefficient is c(0) and increased by 1 up to c(L−1) or is c(L) and increased by 1 up to c(2L−1). Furthermore, the tap coefficients are determined so that filters with the same coefficients are present, and filtered signals are output to adders 1205-1 to 1205-2L.

As shown in FIG. 14, with respect to 4L output signals from FIR filtering group 1204, adder 1205-1 adds filtered signals processed with tap coefficients {c(0), c(2L), . . . ,c(NL−2L)} and filtered signals processed with tap coefficients {c(L), c(3L), . . . ,c(NL-L)} to output to multiple-input phase determining section 1103 and multiple-input selecting section 1104. Adders 1205-2 to 1205-2L add respective filtered signals as illustrated in FIG. 14 to output to multiple-input phase determining section 1103 and multiple-input selecting section 1104.

Multiple-input phase determining section 1103 performs differentially coherent detection on 2L filtered signals in 2L differentially coherent detection sections, and removes modulation components from the signals subjected to the detection in 2L removing the effect of modulation sections to output to phase composition section. The processing in the phase composition section and subsequent sections is the same as described in the first and fourth embodiments, and an optimal phase signal is determined from the synchronization signal of short sequence. The determined phase signal is output to multiple-input selecting section 1103, and the direction switching signal is output to switching sections 203 in FIR filtering group 1204 with 4L filters.

Multiple-input selecting section 1104 selects a filtered signal corresponding to a phase signal from multiple-input phase determining section 1103 from among 2L filtered signals to output to decision section 104 as a filtered signal of optimal phase.

In this way, the oversampling rate corresponds to 2M times the symbol rate, and further it is possible to execute the filtering processing subsequent to A/D conversion section 101 at a rate M/2L times the symbol rate.

Thus, according to this embodiment, it is possible to reduce the processing rate in the filtering section to M/2L times the symbol rate, while executing the processing corresponding to 2M-times oversampling.

In addition, while this embodiment omits descriptions on filter structure, the same effects may be obtained using filters as described in the first to third embodiments.

Further, as a configuration of the phase determining section, the same effects may be obtained using the configuration as described in the first and fourth embodiments.

Seventh Embodiment

Figure 15:
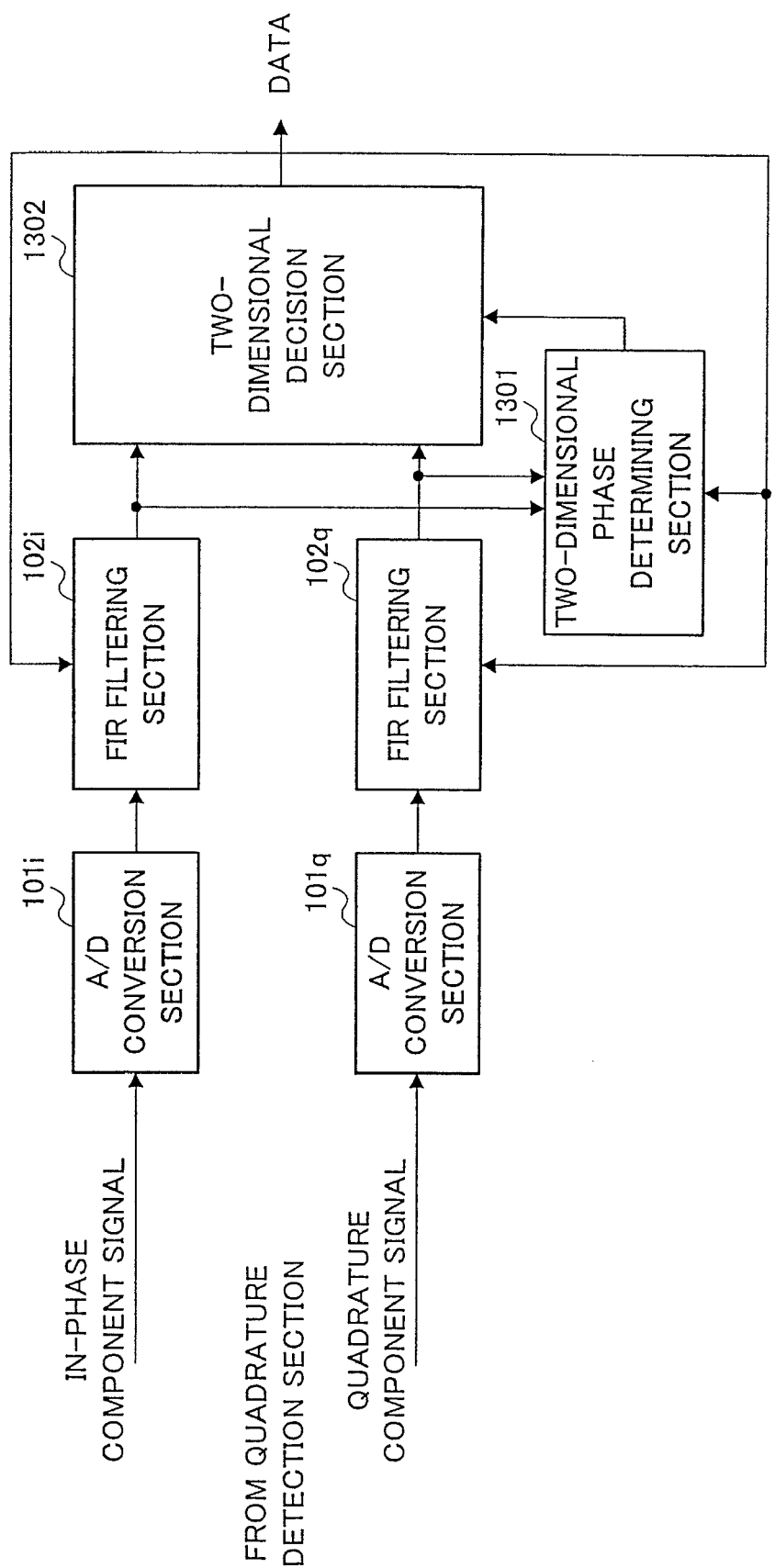
FIG. 15 is a block diagram illustrating a configuration of a digital signal receiving apparatus according to a seventh embodiment of the present invention.

FIG. 15 is a block diagram illustrating a digital signal receiving apparatus according to the seventh embodiment of the present invention. The digital signal receiving apparatus of this embodiment has two A/D conversion sections, 101$i$ and 101$q$, respectively corresponding to in-phase component signal and quadrature component signal output from a quadrature detection section not shown, two FIR filtering sections, 1021 and 102$q$, two-dimensional phase determining section 1301, and two-dimensional decision section 1302. Configurations of the sections will be described specifically below. In addition, A/D conversion sections 101$i$ and 101$q$, and FIR filtering sections, 102$i$ and 102$q$ are respectively the same as A/D conversion section 101 and FIR filtering section 102 as described in the first embodiment, and descriptions thereof are omitted.

Two-dimensional phase determining section 1301 removes initial phase errors and frequency errors using respective signals obtained by performing filtering on the in-phase component signal and quadrature component signal to perform differentially coherent detection. The processing subsequent to the detection is the same as in the first and fourth embodiments. In addition, each of the direction switching signal output to switching section in the FIR filtering sections and the phase signal output to two-dimensional decision section 1302 is the same in in-phase component and quadrature component.

Two-dimensional decision section 1302 makes a decision on the signals obtained by performing filtering on the in-phase component signal and quadrature component signal, based on the phase signal common to the in-phase component and quadrature component output form two-dimensional phase determining section 1301, and generates bit data.

Thus, according to this embodiment, the apparatus is suitable for use in demodulation of quadrature modulation signals such as QPSK modulation signal and QAM modulation signal, and further is suitable for BPSK modulation signal with frequency offset.

Eighth Embodiment

Figure 16:
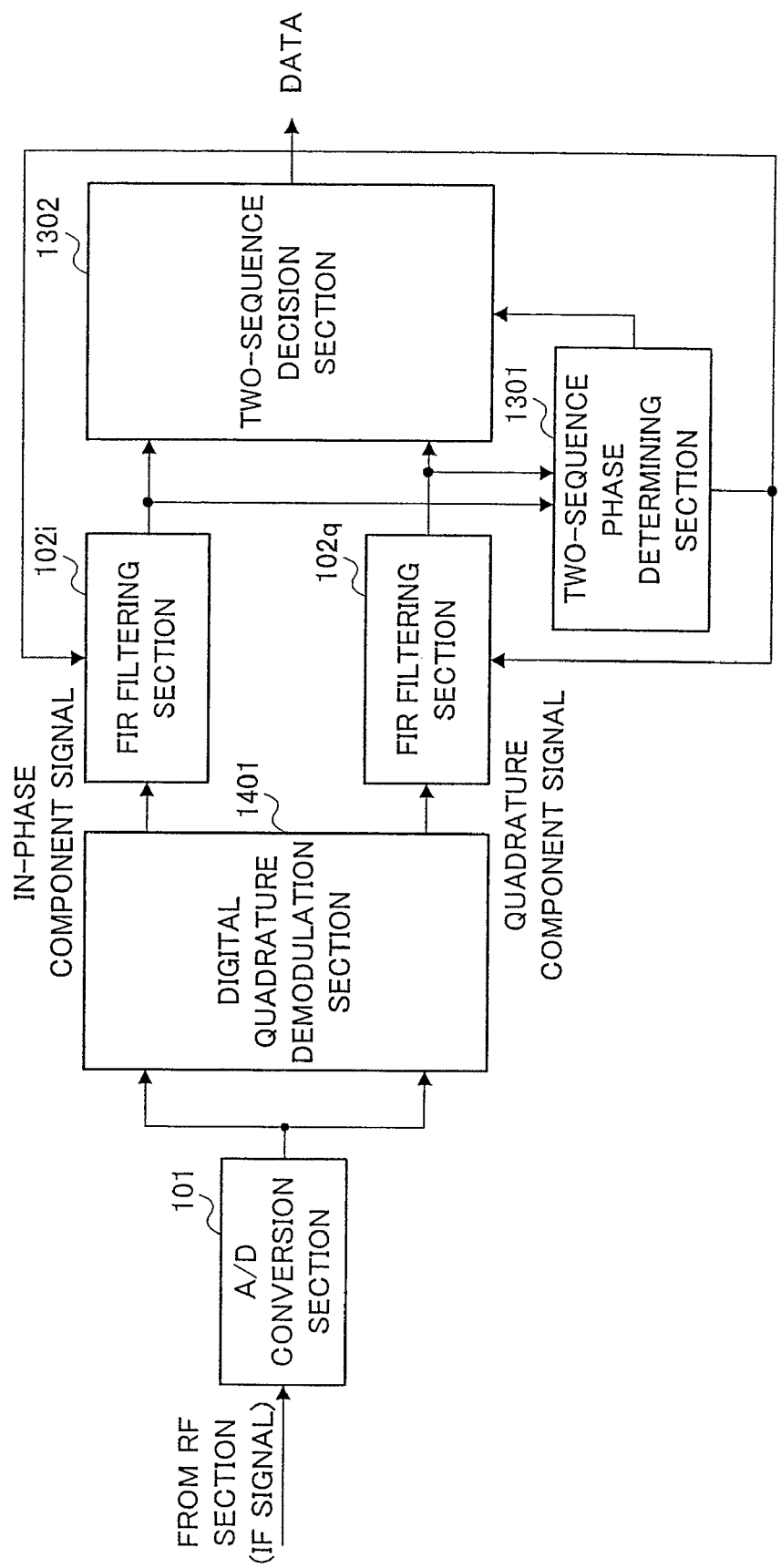
FIG. 16 is a block diagram illustrating a configuration of a digital signal receiving apparatus according to an eighth embodiment of the present invention.

FIG. 16 is a block diagram illustrating a configuration of a digital signal receiving apparatus according to the eighth embodiment of the present invention. In addition, in FIG. 16, the sections common to FIG. 15 are assigned the same reference numerals as in FIG. 15, and specific descriptions thereof are omitted. FIG. 16 differs from FIG. 15 in respects that digital quadrature demodulation section 1401 is added and that A/D conversion sections are replaced with only A/D conversion section 101 that performs A/D conversion on intermediate-frequency-band (IF) signals output from an RF section not shown.

Digital quadrature demodulation section 1401 divides a signal output from A/D conversion section 101 into an in-phase component and quadrature component. The in-phase component is output to FIR filtering section 102$i$, while the quadrature component is output to FIR filtering section 102$q$. The processing subsequent to that in FIR filtering sections 102$i$ and 102$q$ is the same as in FIG. 15, and descriptions thereof are omitted.

Thus, according to this embodiment, since the quadrature detection is implemented in digital signal processing, as compared to the analog processing, it is possible to achieve high reception performance with less direct current offset component and quadrature error, even using quadrature modulation signals such as QPSK modulation signal and QAM modulation signal.

In addition, it may be possible to obtain the same effects using the configuration in the first to third embodiments as a configuration of the FIR filtering section.

Further, it may be possible to obtain the same effects using configurations of multiple-input selecting section 1104 and decision section 104 as described in the fifth and sixth embodiments as a configuration of two-dimensional decision section 1302.

A finite impulse response filter according to a first aspect of the present invention has N (N is a natural number) tap-coefficient multipliers when a signal is input that is obtained by performing oversampling on an analog signal at a rate M (M is an even number of two or more) times the symbol rate, and a first delay-element sequence and a second delay-element sequence provided corresponding to the N tap-coefficient multipliers, where the tap-coefficient multipliers are divided into two groups each with almost a half number of the multipliers, and tap coefficients of the tap-coefficient multipliers are set such that values between tap coefficients of adjacent multipliers of one group are set at values of generally even-symmetry to interpolate tap coefficients of the other group.

According to the aspect, in a direct type or transposition type of finite impulse response filter, a direction in which a digital signal is input is switched using the first delay-element sequence and the second delay-element sequence, N tap-coefficient multipliers are divided into two groups each with almost a half number of the multipliers, and tap coefficients of the tap-coefficient multipliers are set such that values between tap coefficients of adjacent multipliers of one group are set at values of generally even-symmetry to interpolate tap coefficients of the other group. It is thereby possible to increase the processing accuracy of the filter to two times the sampling number. Further, since it is possible to decrease the number of tap-coefficient multipliers that cause the circuitry scale to increase, the circuitry scale can be reduced.

In the aforementioned aspect, the finite impulse response filter according to a second embodiment of the present invention has a switching section that inputs either an output from each delay element of the first delay-element sequence or output from each delay element of the second delay-element sequence to respective one of the tap-coefficient multipliers, and an adder that adds multiplication results of the N tap-coefficient multipliers, where the first delay-element sequence and the second delay-element sequence are provided in parallel with each other, and using the switching section, an input digital signal is input to the N tap-coefficient multipliers in a forward direction through the first delay-element sequence or input to the N tap-coefficient multipliers in a reverse direction through the second delay-element sequence.

According to the aspect, in the direct type of finite impulse response filter, the digital signal is input to tap-coefficient multipliers while switching an input direction, whereby it is possible to increase the processing accuracy of the filter to two times the sampling number, while decreasing the number of tap-coefficient multipliers that cause the circuitry scale to increase.

In the above-mentioned aspect, the finite impulse response filter according to a third aspect of the present invention has N adders which are provided corresponding to the tap-coefficient multipliers and receive as their inputs respective multiplication results, and a switching section that inputs either signals delayed in the first delay-element sequence or signals delayed in the second delay-element sequence to the adders, where the first delay-element sequence delays each of the multiplication results by a sampling cycle to input to an adjacent adder, and the second delay-element sequence delays each of the multiplication results in a direction opposite to a direction in the first delay-element sequence by a sampling cycle to input to an adjacent adder.

According to the aspect, since the finite impulse response filter is configured as a transposition type, the filtering is performed at high speed, and it is thereby possible to increase the processing accuracy of the filter to two times the sampling number, while decreasing the number of tap-coefficient multipliers that cause the circuitry scale to increase.

As described above, according to the present invention, a received signal is subjected to A/D conversion in the oversampling number half that required to meet predetermined characteristics, tap coefficients of an FIR filter are set at a sample sequence obtained by selecting every other one from required tap coefficients, filtering is performed in both forward direction and reverse direction, only a phase is selected that has the least deterioration in reception performance among phases subjected to oversampling, and the decision is made on a filter output signal in the determined delay direction. As a result, it is possible to set multipliers in the filter for fixed coefficients and to perform fast calculation, and further it is possible to decrease the number of tap-coefficient multipliers that cause the circuitry scale to increase and to reduce the circuitry scale in the receiving apparatus.

INDUSTRIAL APPLICABILITY

The present invention relates to a digital signal receiving apparatus having a finite impulse response filter that performs digital filtering, and for example, is suitable for use in baseband signal processing in a radio communication receiving apparatus.

The invention claimed is:

1. A finite impulse response filter to which a digital signal obtained by performing sampling on an analog signal at a rate of M times of a symbol rate where M is an even number of two or more, is input, and which has characteristics of even taps, comprising:
  a plurality of tap-coefficient multipliers, each of the tap-coefficient multipliers multiplying an input to the respective tap-coefficient multiplier with a tap coefficient;
  a first plurality of delay elements corresponding to the plurality of tap-coefficient multipliers;
  a second plurality of delay elements corresponding to the plurality of tap-coefficient multipliers,
  a switcher that switches an input to each of the plurality of tap-coefficient multipliers between an output of one of the first plurality of delay elements and an output of one of the second plurality of delay elements; and
  an adder that adds outputs of the tap-coefficient multipliers,
  wherein the switcher inputs output signals of the first plurality of delay elements to the plurality of tap-coefficient multipliers in a forward direction or inputs output signals of the second plurality of delay elements to the tap-coefficient multipliers in a reverse direction.

2. A digital signal receiving apparatus, comprising:
  a finite impulse response filter according to claim 1;
  an A/D converter that performs oversampling on an analog signal received at a rate of M times of a symbol rate where M is an even number of two or more;
  a decider that makes a decision on a filtered signal to generate bit data; and
  a phase determiner that determines a phase based on the filtered signal,
  wherein the decider makes a decision based on the phase.

3. The digital signal receiving apparatus according to claim 2, wherein the switcher performs switching when a predetermined signal sequence is repeated and input to the finite impulse response filter.

4. The digital signal receiving apparatus according to claim 2, wherein the finite impulse response filter comprises:
  a delayer that delays a digital signal subjected to A/D conversion by a predetermined time; and
  a delayed signal switcher that outputs one of a signal delayed by the delayer and the digital signal subjected to A/D conversion,
  wherein the delayed signal switcher outputs the signal to the second plurality of delay elements.

5. The digital signal receiving apparatus according to claim 2, wherein the phase determiner comprises:
  a phase composer that performs vector composition on a signal on a plurality of phases using signals filtered by the finite impulse response filter;
  a maximum value•optimal phase detector that detects a maximum value of a vector composition value in the phase composer and a phase of the maximum composition value;
  a comparer that compares the maximum value detected in the maximum value•optimal phase detector with a previous maximum value; and
  an optimal phase switcher that outputs one of the phase detected in the maximum value•optimal phase detector and a phase of the previous maximum value to the decider, corresponding to a result compared in the comparer.

6. The digital signal receiving apparatus according to claim 5, wherein:
  the phase determiner comprises a differentially coherent detector that removes an initial modulation component from known modulation signals subjected to filtering; and
  the phase composer performs vector composition on a signal on each phase with respect to the known modulation signal from which the initial modulation component is removed.

7. The digital signal receiving apparatus according to claim 5, wherein the switcher in the finite impulse response filter performs switching corresponding to a result compared in the comparer.

8. The digital signal receiving apparatus according to claim 5, wherein the phase determiner comprises:
a phase composer that performs vector composition on a signal on each phase using signals filtered by the finite impulse response filter;
a maximum value•optimal phase detector that detects a maximum value of a vector composition value in the phase composer and an optimal phase of the maximum composition value;
an adjust delayer that delays a signal filtered by the finite impulse response filter by a predetermined time;
a divider that divides a signal sequence delayed in the adjust delayer into a plurality of sequences;
a selector that selects a signal corresponding to a phase detected in the maximum value•optimal phase detector from signals divided in the divider;
multipliers that multiply the signal selected in the selector by coefficients determined from a maximum signal level of a received signal, and signal levels on two phases adjacent to a phase of the maximum signal level among phases obtained by performing oversampling on the received signal, respectively;
a maximum phase detector that detects a phase such that a result calculated in the multiplier is maximum; and
a determiner that determines a phase based on a result detected in the maximum value•optimal phase detector and a result detected in the maximum phase detector.

9. The digital signal receiving apparatus according to claim 8, wherein the switcher in the finite impulse response filter performs switching, when the maximum phase detector detects the result corresponding to either of the two adjacent phases of the multipliers.

10. The digital signal receiving apparatus according to claim 2, wherein:
the A/D converter performs oversampling on a received signal that is an analog signal received at a rate M/L times a symbol rate to branch a digital signal to L signals;
L finite impulse response filters are provided in parallel with one another, set for different combinations of tap coefficients, and respectively perform filtering on L digital signals; and
the phase determiner that determines a phase, makes a decision on the received signal based on signals filtered by a plurality of the finite impulse response filters, and selects a filtered signal including a signal on the determined phase, as a signal to output to the decider.

11. The digital signal receiving apparatus according to claim 2, further comprising:
a multiplexing divider that multiplexes and divides a digital signal subjected to A/D conversion into two same signals, demultiplexes the two same signals into 2L signals, respectively and outputs each of the 2L signals; and
a delayer that delays L signals by a time two times a sampling cycle in the A/D converter among 4L signals output from the multiplexing divider, wherein:
4L finite pulse response filters are provided in parallel with one another, the number of combinations of tap coefficients of the finite impulse response filters being 2L, and respectively perform filtering on 4L digital signals; and
the phase determiner determines a phase, makes a decision on the received signal based on signals filtered by a plurality of the finite impulse response filters, and selects a filtered signal including a signal on the determined phase, as a signal to output to the decider.

12. The digital signal receiving apparatus according to claim 2, wherein:
two A/D converters are provided and respectively perform oversampling on an in-phase component and a quadrature component of a received signal that is an analog signal;
two finite impulse response filters are provided and respectively perform filtering on the in-phase component and the quadrature component subjected to A/D conversion;
an optimal phase determiner having inputs of two systems determines an optimal phase from output signals of the two finite impulse response filters; and
a determiner having inputs of two systems performs signal determination from the output signals of the two finite impulse response filters and output signals of the optimal phase determiner having inputs of two systems.

13. The digital signal receiving apparatus according to claim 2, further comprising a quadrature detector that divides a signal subjected to A/D conversion into an in-phase component and a quadrature component, wherein:
two finite impulse response filters are provided and respectively perform filtering on the in-phase component and the quadrature component;
an optimal phase determiner having inputs of two systems determines an optimal phase from output signals of the two finite impulse response filters; and
a determiner having inputs of two systems performs signal determination from the output signals of the two finite impulse response filters and output signals of the optimal phase determiner having inputs of two systems.

14. The digital signal receiving apparatus according to claim 2, wherein the received signal has a signal format in which an information signal and a synchronization signal used in the phase determiner can be temporally changed.

15. The digital signal receiving apparatus according to claim 14, wherein the received signal has a signal format in which the synchronization signal has a plurality of same sequences.

16. The digital signal receiving apparatus according to claim 14, wherein the received signal has a signal format in which a null signal with the same duration as that of the synchronization signal is provided between the synchronization signal and the information signal.

17. The digital signal receiving apparatus according to claim 14, wherein the received signal has a signal format in which a null signal with a duration corresponding to a time taken to resolve a transition state of the finite impulse response filter is provided between the synchronization signal and the information signal.

18. The digital signal receiving apparatus according to claim 14, wherein the received signal has a signal format with the synchronization signal that is a known modulation signal and is mapped onto a signal point with a maximum signal distance.

19. A finite impulse response filter to which a digital signal obtained by performing sampling on an analog signal at a rate of M times of a symbol rate where M is an even number of two or more, is input, and which has characteristics of even taps, comprising:
a plurality of tap-coefficient multipliers, each of the tap-coefficient multipliers multiplying the digital signal with a tap coefficient;
a plurality of adders, each of which correspond to one of the plurality of tap-coefficient multipliers, one of the adders adding an output of a corresponding one of the tap-coefficient multipliers to an output of one of a first plurality of delay elements or a value of zero, another one of the adders adding an output of a corresponding one of the tap-coefficient multipliers to an output of one of a second plurality of delay elements or a value of zero, and each of the remaining plurality of adders adding an output of a corresponding one of the tap-coefficient multipliers to one of the first plurality of delay elements or one of the second plurality of delay elements; and a switcher that inputs to the plurality of adders of signals delayed by the first plurality of delay elements, signals delayed by the second plurality of delay elements, or a value of zero, wherein the first plurality of delay elements delay one of two sets of the addition results output from the plurality of adders to input to an adjacent adder, and the second plurality of delay elements delay the other set of the two sets of the addition results output from the plurality of adders in a direction opposite to a direction in the first plurality of delay elements to input to an adjacent adder.

* * * * *